(12) United States Patent
Gefen et al.

(10) Patent No.: US 7,032,081 B1
(45) Date of Patent: Apr. 18, 2006

(54) SYSTEM AND METHOD FOR ENABLING NON-VOLATILE MEMORY TO EXECUTE CODE WHILE OPERATING AS A DATA STORAGE/PROCESSING DEVICE

(75) Inventors: Moshe Gefen, Modiin (IL); Shuka Zernovizky, Tel-Aviv (IL); Amir Ban, Ramat-Hasharon (IL)

(73) Assignee: M-Systems Flash Disk Pioneers Ltd., Kfar Saba (IL)

( * ) Notice: Subject to any disclaimer, the term of this patent is extended or adjusted under 35 U.S.C. 154(b) by 1167 days.

(21) Appl. No.: 09/629,966

(22) Filed: Jul. 31, 2000

(51) Int. Cl.
*G06F 12/00* (2006.01)

(52) U.S. Cl. ...................... 711/154; 711/103

(58) Field of Classification Search ............... 711/103, 711/5, 152, 154, 155, 156, 163

See application file for complete search history.

(56) References Cited

U.S. PATENT DOCUMENTS

| | | | | |
|---|---|---|---|---|
| 5,333,300 A | * | 7/1994 | Fandrich | 711/103 |
| 5,463,757 A | * | 10/1995 | Fandrich et al. | 711/103 |
| 5,491,790 A | * | 2/1996 | Keeley et al. | 714/36 |
| 6,189,070 B1 | * | 2/2001 | See et al. | 711/103 |

* cited by examiner

*Primary Examiner*—Matthew D. Anderson
(74) *Attorney, Agent, or Firm*—Mark M. Friedman

(57) ABSTRACT

A system and method for enabling concurrent usage of non-volatile memory for code execution and data storage/processing, comprising a hardware mechanism that can support automatic suspend and resume operations. This mechanism entails the integration of a suspend logic circuit and a resume logic circuit into the chip hardware, or the stationing of the logic chip in any way that it can operate together with the chip. This system and method enable a Flash memory chip to process code execution while it is processing erase/program operations, avoiding conflicts that ordinarily crash such a system. This is achieved by sensing the operation status of the chip and the CPU/Bus activity, and commanding the flash memory device to suspend and/or resume program/erase operations at appropriate times, so as not to conflict with read requests.

21 Claims, 2 Drawing Sheets

SYSTEM AND METHOD FOR ENABLING NON-VOLATILE MEMORY TO EXECUTE CODE WHILE OPERATING AS A DATA STORAGE/PROCESSING DEVICE

FIELD AND BACKGROUND OF THE INVENTION

The present invention relates to a system for enabling non-volatile memory to execute code while operating as a data storage device.

The primary usage of non-volatile memory is for code execution. In the market of non-volatile code storage memory, flash memory is replacing the ROM various families (ROM, PROM, EPROM, EEPROM) due to its better cost-structure, ease of manufacturing and high densities. Flash is commonly used both as a stand-alone device and as embedded memory. The competition in this market concentrates on condensing the bits of information in a smaller silicon area in order to reduce the cost of the devices. The most common flash type used for code execution is known as NOR Flash. The NOR Flash enables random access to each of its addresses and hence enables to execute code from it. For this reason the NOR Flash is known as an XIP memory, where XIP stands for eXecutable In Place.

While we discussed so far the usage of flash memory for code execution, another emerging market for flash memory is starting to grow and become dominant—the data storage market. Data storage applications require a file system management on the flash memory. Flash memory used for data storage is called a Flash disk and is composed of H/W (flash memory) and a S/W package (file system management, OS interface etc.).

Modern applications usually require flash memory for both code execution and data storage. Today, most architectures use separated devices (or sets of devices) for each functionality. It is very desirable to use the same device (single device) to store both the data and the code of the application. The main benefits are:

reducing real estate requirements, chip count, silicon size and power consumption.

The following scenario illustrates the main problem with this approach:

lets assume that there are two tasks running under the OS in the application.

The first task (T1) is the data storage driver task. It is responsible of storing all the application data on the flash memory. The second task (T2) is some code which is executed from the flash memory (the same flash memory, of course).

The scenario begins with T1 issuing an erase command to some area of the flash memory, as part of the data management requirements. Typical erase time of NOR Flashes is 1 sec. During this period of time (within this 1 sec), OS gives T2 a time slot and T2 starts executing code from the flash memory. At this moment the operation will fail and cause the whole application to fail. The reason is that the flash memory is not available for read operations (e.g., execution of code) while it's busy erasing/programming another section. The OS and T2 are unaware of the fact that the flash isn't available now. The OS and T2 expect that the code stored on the flash will always be available for execution, but this is not the case. As explained above, there are many cases when the flash is not available for execution of the stored code. In fact—it will be unavailable every time it's busy erasing/programming sections following T1 requests.

Known Solutions:

1. Using two devices, one for data storage and the second as code storage (XIP). As mentioned above, this is the most common architecture that is in use today. See FIG. 1 for a graphic description of this solution.

This solution has drawbacks of higher real estate requirements, chip count, silicon size and power consumption.

2. Using a single device with multi-bank architecture, which can be simultaneously accessed for read and erase/program. Several flash vendors have started to offer flash devices with multi-bank (usually dual-bank) architecture. With this approach the real estate requirements are reduced and also the chip count is reduced to one. The disadvantage of this solution is the overhead of the silicon (due to the multi-bank design). The estimated cost overhead of this design over a regular design is 30%, so basically one has to pay for the additional functionality with silicon. This solution gains popularity only in real-estate-critical applications, because otherwise it is cost prohibitive. See FIG. 2 for a graphic illustration of this solution.

3. Using a single device with a special system S/W that controls and schedules all the tasks of the system, for example, in Intel's PSM. This solution uses the S/W commands of suspend and resume of the flash in order to enable the dual functionality of the device. With this solution the problem of unawareness is solved, but the cost is the complicated integration. This requires a solution to be tailored specifically for every CPU and/or OS. The special system S/W is added to the OS and controls and schedules all tasks and interrupts. The time of integration and development of this solution is excessively long since the complexity is high. In addition this is a very intrusive approach, which might suit some niche markets.

There is thus a widely recognized need for, and it would be highly advantageous to have, a system that can enable true simultaneous usage of non-volatile memory for both code execution and data storage.

The present invention provides another approach to solve the problem of one non-volatile (flash) device (or a set of devices) used both for data storage/processing and code execution. The solution enables proper functionality of both usages and in particular will enable execution of code from the flash at any time, including times when the flash is busy erasing/programming some sections.

The present invention is of a hardware application that enables flash memory devices to be both created and operated in an efficient manner, enabling usage of Flash memory for code execution and data storage/processing concurrently.

SUMMARY OF THE INVENTION

According to the present invention there is provided a system for enabling usage of non-volatile memory, and in particular flash memory, for code execution and data storage/processing, comprising:

CPU/Bus/Controller;

Non volatile array;

non volatile device circuitry; and logic circuit where said logic circuit is a hardware mechanism that enables supporting of automatic suspend and resume operations.

The present invention provides for designing and implementing an on-chip H/W mechanism that can support an automatic suspend and resume operations. This solution will enable easy integration to any CPU/OS.

The present invention enables a non-volatile memory chip, such as a flash memory chip, to process code execution while it is processing erase/program operations. This is achieved by sensing the operation status of the chip and the CPU/Bus activity, and commanding the flash memory device to suspend and/or resume program/erase operations at appropriate times, so as not to collide with read requests. The system thereby buffers the CPU/Bus/Controller from executing read commands while the chip is processing program/erase operations.

BRIEF DESCRIPTION OF THE DRAWING

The invention is herein described, by way of example only, with reference to the accompanying drawings, wherein.

DESCRIPTION OF THE PREFERRED EMBODIMENT

Figure 1:
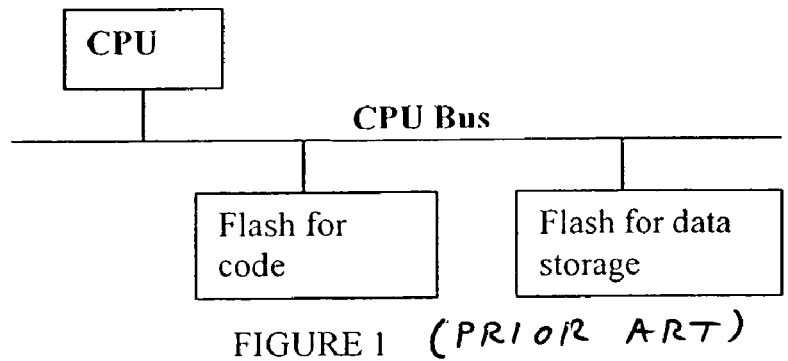
FIG. 1 is an illustration of the most common current solution, two separate devices are incorporated into the memory chip for the purposes of code execution and data processing.
Figure 2:
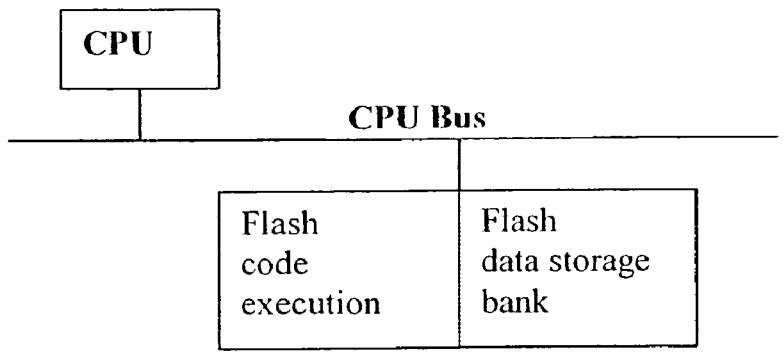
FIG. 2 illustrates an alternative solution to achieving both code execution and data processing in a Flash memory chip, wherein multi-bank architecture is used.

The present invention is of a system and method for enabling simultaneous usage of code execution and data storage and processing using non-volatile memory chips.

Specifically, the present invention can be used to execute code on flash chips, while concurrently processing stored data on the same chip. This is based on the usage of automatic suspend and automatic resume operations.

Figure 3:
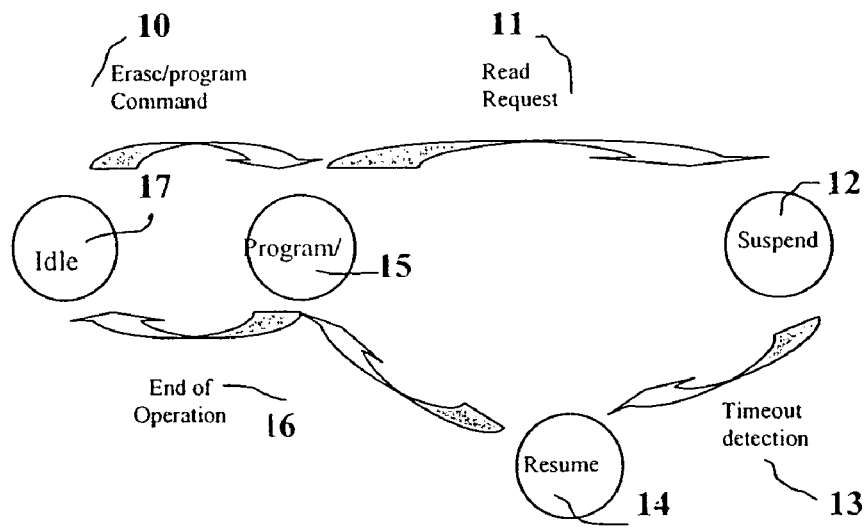
FIG. 3 illustrates the basic operation of the system according to the present invention.
Figure 4:
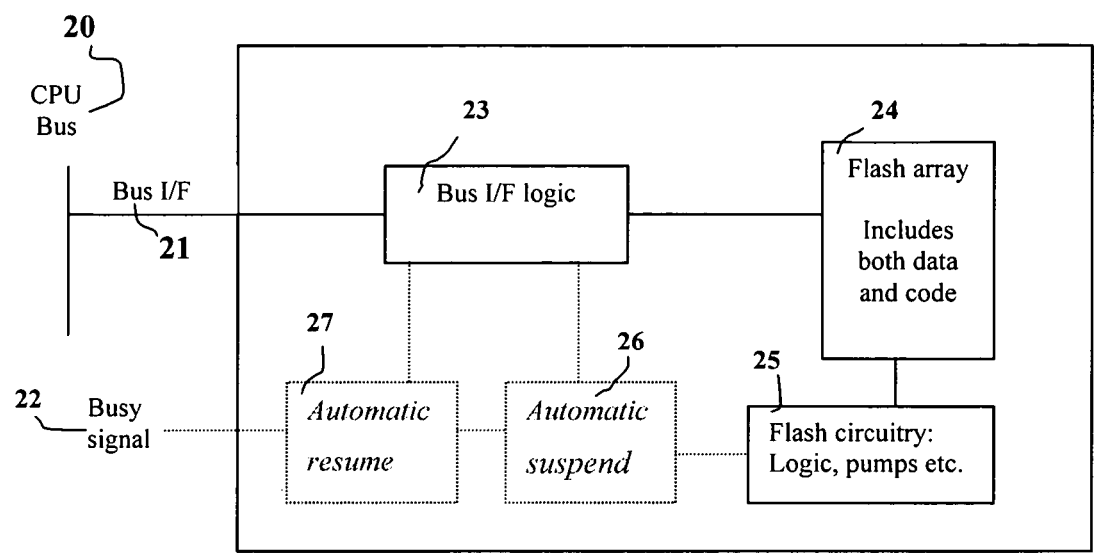
FIG. 4 is a flow chart of the basic components of the system according to the present invention.

The principles and operations of such a system according to the present invention may be better understood with reference to the drawing, and the accompanying descriptions, wherein:

FIGS. 3 and 4 illustrate the basic components and operations of the current invention in its preferred usage. The hardware mechanism of the present invention, which is one logic circuit (or a few circuits), is designed so as to enable automatic suspend and automatic resume of program and/or erase operations in the following manner. For example, consider that there is an active erase/program command 10 issued to the memory device. The memory device is executing the erase/program operation 15 and at the same time a read request 11 is registered. As opposed to current methods whereby the read request will be unable to be executed, and may crash the system, the present invention temporarily suspends 12 the program/erase operation 15. When in suspend mode 12, the CPU/Bus is free to continue with the read requests. The read operation will subsequently be monitored in order to detect a timeout 13 (a predetermined period of time in which no read operation is done. Upon detection it automatically gives a command to resume operations 14, allowing the program/erase operation 15 to continue. In greater detail, the system operates as follows:

1. Automatic execution of suspend operation operates on the following conditions:
   1.1 The device is busy with erase/program operation 15.
   1.2 A read attempt is being done from the device 11.

2. Indication of the device entering the suspend state 12 (the time known as suspend latency) is provided with a busy signal 22 (FIG. 4). The Busy signal, which is some physical signal to the CPU/Bus, will be used on the platform to signal that the code, stored on the flash chip, is about to be available for execution. The host CPU/Bus/Controller 20 or host Bus 21 uses this signal to hold/retry operation using its standard hold/retry mechanisms, or any other means provided by the CPU/Bus/Controller to prevent a crash due to a failed read attempt.

3. Automatic execution of resume operation 14 upon completion of all the read cycles. Completion will be detected using timeout detection 13 (a predetermined period of time in which no read operation is done). The execution of the resume operation may be commanded based on alternative factors, such as a predetermined time interval or any other chosen method.

Advantages:

First of all, this invention enables using one non-volatile chip, or chip banks acting as unified chips, for both data storage/processing and code execution. By doing this it enables significant reduction of real estate requirements, chip count, silicon size and power consumption. Comparing this invention to the other solution in the market, Intel PSM (other solutions: a. and b. have a much higher cost) points to the fact that the big advantage here is the easy integration of the flash device (H/W and S/W) to the platform environment (CPU, Bus and OS). With this solution there is no need to interfere with the OS components (e.g. scheduler) and other software ingredients. The OS and all the tasks running under it are totally unaware of the flash memory condition and they can access it regardless of its condition. The only integration required is a simple H/W integration of to allow the CPU, Bus or Controller to hold/retry operations that occur during the suspend latency time. This hardware integration requires the implementation of a regular and common hold/retry mechanism, or any other mechanism existing on the CPU/Bus that can delay execution of a read/fetch cycle. In order to achieve this signaling and enabling dual operation of data storage and code execution on a single chip, the logic circuit needs to be either imbedded in the memory chip or added as an external logic, to facilitate the automatic resume and suspend.

Automatic Suspend Mechanism:

This section explains the mechanism and implementation of the automatic suspend feature. The automatic suspend logic 26 (FIG. 4) is operated when an erase or program operation begins 15 (FIG. 3). When detecting one of these operations (erase or program) the automatic suspend logic 26 is triggered. From this moment onwards, the logic waits for a read operation 11 from the device (read operations that requires the device to output real data as opposed to status bits or similar). If the erase/program operation 15 is finished before receiving any read operation 11, the logic and the chip will both return to the idle state 17. Identification of the read operation will be based on the regular and normal means that are supplied by the device (e.g. control signals, address signals, read commands). Upon detection of the read operation 11 the automatic suspend logic 26 executes a process that enters the device into the suspend state 12. The logic can use existing mechanisms inside the device to do this task (e.g. executing the suspend command which is available in certain devices). In addition—the logic may mark in a certain place (e.g. I/O port or a dedicated register) that the device has entered the automatic suspend state 12. This marking can be used by the file system management S/W. In addition, the logic will indicate that the device is on its way to the automatic suspend state 12 using an external signal (Busy signal) 22. This signal can be used by the platform to hold/retry the read operation 11 attempt or any other mechanism in the CPU/Bus that can delay execution of read/fetch cycles. The logic is also responsible of verifying that the device has actually entered the automatic suspend state 12. After the verification phase—the Busy signal 22 will be turned off (to indicate that the device has entered the automatic suspend state 12. From this moment onwards the device is ready to perform read requests as required.

Automatic Resume Mechanism:

The automatic resume logic 27 starts to operate when the device enters the automatic suspend state 12. The target of this logic is to resume the program/erase operation 15 that was interrupted by the automatic suspend logic 26. This logic should monitor the read operations done from the device, for example, by using the same techniques as the automatic suspend logic 26. The logic is responsible to resume the suspended operation. One suggested implementation is to wait for a break in the read operations of the device. When the break is long enough (depending on the application and environment) the logic executes a process which causes the device to resume the program/erase operation 15 (e.g. executing the resume command which is available in certain devices). The logic contains some mechanism to determine if the break is a real break or just a temporary break (e.g. a timer that counts the no-read-operation time). The logic is also responsible to turn off the mark that shows (e.g. I/O port or a dedicated register) that the device has entered the automatic suspend state 12.

While the invention has been described with respect to a limited number of embodiments, it will be appreciated that many variations, modifications and other applications of the invention may be made.

What is claimed is:

1. A system that executes code while processing data operations using a non-volatile memory device, comprising:
   host for accessing said memory device;
   non volatile array for holding code and data of said system;
   non volatile device circuitry for controlling content and activity of said non volatile array; and
   logic circuit, separate from said host, for enabling automatic suspending and/or automatic resuming of operations in response to a read request from said host.

2. The system of claim 1, wherein said non-volatile memory device is a flash memory device.

3. The system of claim 1, wherein said logic circuit enables code execution and data storage/processing facilities within a single chip device with a single silicon die.

4. The system of claim 1, wherein said logic circuit enables code execution and data storage/processing facilities within a bank of single memory chips with single silicon dies.

5. The system of claim 1, wherein said logic circuit is embedded into the memory device.

6. The system of claim 1, wherein said logic circuit is operative to monitor status of current operations in said memory device.

7. A method for executing code while processing data on a non-volatile memory device, comprising the steps of:
   i. adding at least one logic circuit to the non-volatile memory device;
   ii. monitoring status of current operations in said memory device, by said at least one logic circuit;
   iii. signaling if the device is available for code execution, by said at least one logic circuit; and
   iv. commanding the device to suspend and/or resume device operations in response to a read request, by said at least one logic circuit.

8. A method for executing code while processing data on a non-volatile memory device, comprising the following steps:
   i. adding at least one logic circuit to the non-volatile memory device;
   ii. sensing a read request while the device is in program/erase mode/operation, by said at least one logic circuit;
   iii. in response to said sensing, entering of program and/or erase operations into suspended mode, by said at least one logic circuit;
   iv. signaling to CPU/Bus to delay executing said read request, by said at least one logic circuit;
   v. turning off signal to allow CPU/Bus to execute said read request, by said at least one logic circuit; and
   vi. exiting of said device from said suspended mode to continue program/erase operation, by said at least one logic circuit.

9. A single flash memory device comprising:
   a suspend logic circuit for enabling hardware initiated suspending of data processing operations in response to at least one read request received by the memory device from a host; and
   a resume logic circuit for enabling hardware initiated resuming of data processing operations.

10. A memory device comprising:
   (a) a non-volatile memory;
   (b) circuitry for reading, programming and erasing said non-volatile memory; and
   (c) a hardware mechanism for suspending an activity of said circuitry in response to at least one read request received by the memory device from a host.

11. The memory device of claim 10, wherein said hardware mechanism also is operative to resume said activity of said circuitry after said circuitry has finished processing said at least one read request.

12. The memory device of claim 10, wherein said activity is erasing said non-volatile memory.

13. The memory device of claim 10, wherein said activity is programming said non-volatile memory.

14. The memory device of claim 10, wherein said hardware mechanism includes at least one logic circuit.

15. The memory device of claim 10, wherein said suspending of said activity includes:
   (A) indicating to said host that issued said at least one read request that execution of said at least one read request should be delayed; and
   (B) subsequently, indicating to said host that the memory device is available for reading.

16. The memory device of claim 10, wherein said hardware mechanism is further operative to monitor said processing of said at least one read request to determine when said circuitry has finished processing said at least one read request.

17. A method for managing a memory device that includes a non-volatile memory and that is accessed by a host, comprising the steps of:
 (a) commencing an operation selected from the group consisting of erasing the non-volatile memory and programming the non-volatile memory, by the memory device;
 (b) during said operation, requesting a read operation, by the host; and
 (c) in response to said request, suspending said operation, by the memory device.

18. The method of claim 17, further comprising the step of:
 (d) in response to said request, signaling to the host to delay execution of said request, by the memory device.

19. The method of claim 18, further comprising the step of:
 (e) in response to said signal, delaying execution of said request, by the host.

20. The method of claim 19, further comprising the step of:
 (f) signaling the host to resume execution of said request, by the memory device.

21. The method of claim 20, further comprising the steps of:
 (g) subsequent to said suspending, monitoring a conclusion of read requests from the host, by the memory device; and
 (h) upon detecting said conclusion, resuming said operation, by the memory device.

* * * * *